(12) United States Patent
Francisco et al.

(10) Patent No.: US 8,547,122 B2
(45) Date of Patent: Oct. 1, 2013

(54) TEMPERATURE MEASUREMENT OF ACTIVE DEVICE UNDER TEST ON STRIP TESTER

(75) Inventors: Ronaldo Francisco, Chandler, AZ (US); Chi Lung Wong, Gilbert, AZ (US); Tim Messang, Gilbert, AZ (US); Ezana Haile Aberra, Chandler, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 262 days.

(21) Appl. No.: 13/180,053

(22) Filed: Jul. 11, 2011

(65) Prior Publication Data

US 2013/0015869 A1 Jan. 17, 2013

(51) Int. Cl.
 *G01R 31/00* (2006.01)
 *G01R 31/10* (2006.01)
 *G01R 31/02* (2006.01)

(52) U.S. Cl.
 USPC ............. 324/750.03; 324/750.06; 324/762.01

(58) Field of Classification Search
 USPC ........................... 324/750.03, 750.06, 762.01
 See application file for complete search history.

(56) References Cited

U.S. PATENT DOCUMENTS

| | | | |
|---|---|---|---|
| 6,879,172 B1 * | 4/2005 | Eppes et al. ............. | 324/750.03 |
| 7,256,593 B2 | 8/2007 | Treibergs ................. | 324/754.05 |
| 2002/0050834 A1 * | 5/2002 | Olsen et al. ................... | 324/760 |
| 2005/0206368 A1 | 9/2005 | Lopez et al. ............. | 324/750.07 |
| 2008/0029763 A1 * | 2/2008 | Kasukabe et al. .............. | 257/48 |
| 2008/0116922 A1 | 5/2008 | Blaney et al. ............ | 324/750.03 |
| 2008/0116924 A1 | 5/2008 | Blaney et al. ............ | 324/754.07 |
| 2008/0302783 A1 | 12/2008 | Wong et al. ................... | 219/494 |

FOREIGN PATENT DOCUMENTS

WO 01/90710 A1 11/2001

OTHER PUBLICATIONS

International Search Report and Written Opinion, PCT/US2012//045932, 14 pages, Nov. 6, 2012

* cited by examiner

*Primary Examiner* — Huy Q Phan
*Assistant Examiner* — Kenny K Dang
(74) *Attorney, Agent, or Firm* — King & Spalding L.L.P.

(57) ABSTRACT

A plurality of devices under test (DUT) are arranged in a strip tester having a temperature controlled heater block. Each DUT has a respective set of electrical test probes and a thermally conductive test probe for electrically and thermally coupling, respectively, of the strip tester to the DUTs. Temperature measurement of each of the plurality of DUTs is performed by a temperature measuring device. The temperature measuring device can be part of the test board of the strip tester and will be in thermal communications with the DUT through the thermally conductive test probe, or temperature of the DUT can be measurement with an RTD embedded in the thermally conductive test probe, thereby providing faster thermal response time.

28 Claims, 3 Drawing Sheets

TEMPERATURE MEASUREMENT OF ACTIVE DEVICE UNDER TEST ON STRIP TESTER

TECHNICAL FIELD

The present disclosure relates generally to testing and/or calibration of active integrated circuit devices with an integrated circuit strip tester, and more particularly, to temperature measurement of the active integrated circuit devices during the testing and/or calibration thereof.

BACKGROUND

Precise and accurate active device under test (DUT) test site temperature measurement reduces errors when using a temperature controlled thermal strip chuck. The test site temperature will still change by some small amount, however the temperature measurement device will catch and react to these small temperature changes for a further reduction of errors caused by temperature changes during measurement and calibration (trimming) of the DUT. Tightly controlled temperature improves calibration accuracy and improves repeatability of the DUT operating characteristics.

SUMMARY

What is needed is accurate measurement and control of a DUT strip test site temperature to limit temperature variances that can reduce the effects of thermal lag differences (difference in material thermal dissipations), and reduce soak times to obtain thermal equilibrium of all material in the test site area during DUT temperature measurement. The objective would be a relatively planar temperature distribution across the thermal strip test chuck. That all devices on the thermal strip chuck would be subjected to substantially the same temperature at the test site enhances repeatability of the DUT testing process for all of the DUTs. Temperature uniformity of the DUTs under test insures repeatability of test results.

According to the teachings of this disclosure, a temperature measuring device, e.g., resistance temperature detector (RTD), thermocouple, thermistor, etc., having a similar thermal response time as the DUT is used to measure the DUT temperature. The similarity in thermal response times between the temperature measuring device and the DUT minimizes thermal lag therebetween of the measured and actual temperature measurements during DUT testing and/or calibration.

Active DUT measurement requires the temperature measuring device (e.g., the RTD) and the DUT (device under test) to be in very close proximity with each other at the time of measurement (plus soak time for achieving temperature equilibrium) between the temperature measuring device and the measured DUT.

A thermal connection through a heat conductive material or actual physical surface connection between the DUT and the temperature measuring device would create faster heat transfers and faster temperature equilibrium. During temperature equilibrium the test site, the DUT and temperature measuring device temperatures are all equal, and is therefore the optimum time to measure and trim temperature accuracy of the integrated circuit DUT.

The exposed pad of a DUT is the area of the DUT package having the optimum thermal conductance to the die of the device. Therefore an assumption can be made that the temperature measurement on the exposed package pad is substantially the same as the DUT temperature.

For example, the minimum dimension of the exposed pad for the 2×3 DFN package is 1.3 mm×1.5 mm, and for a TDFN package is 1.2 mm×1.2 mm. The measurement device contact area preferably is smaller or of substantially the same size as the exposed pad. A good thermal conductive material may also be used between the measuring device and the exposed pad, but still should be about the same aforementioned contact area. The temperature measuring device or thermal contact material dimension also has to fit between the pogo pin contacts of DUT test contactor.

It is contemplated and within the scope of this disclosure that an RTD type temperature probe would meet the aforementioned dimensional requirements. It is also contemplated and within the scope of this disclosure that use of thermally conductive pogo-pin that contacts the exposed pad surface during device testing may also be an option and the measuring device would then be touching the other end of the pogo-pin.

The additional circuitry to obtain digital temperature from the temperature measuring device can be imbedded into a DUT test board. The number of temperature measuring devices (e.g., RTDs) will depend on the parallelism of testing. For example, 26 temperature measuring devices per a row will be required for a test strip having a parallel plan of 26×5 rows per touchdown for testing of 130 DUTs per touchdown of the strip tester. Thus a thermally conductive board or frame can be used to hold a plurality of packages, e.g., 2×3 DFN packages, in place with the same locations as they would while on a strip tester.

The DUTs are placed and locked on the thermal conductive board or frame, and the strip test handler/strip test chuck is set to test at the specified temperature a final test. A calibration routine or program is run to read the temperature out of the calibration reference units and adjust the calibration offsets of the temperature measuring devices, e.g., RTD+RTD modules, to read the same temperature as the calibration reference units.

According to a specific example embodiment of this disclosure, an integrated circuit device strip tester that measures temperature of each device under test comprises: a temperature controlled heater block have a plurality of locations for placement thereon of a plurality of integrated circuit devices under test; each of the plurality of integrated circuit devices under test comprises a plurality of electrical connection pads on a first face of the integrated circuit device, an exposed die pad in thermal communications with a die of the integrated circuit device, and a second face of the integrated circuit device in thermal communications with the temperature controlled heater block; a contactor assembly having a plurality of electrical connection test probes and a thermally conductive test probe for each of the plurality of integrated circuit devices under test and arranged to come into contact with a respective one of the plurality of integrated circuit devices under test, wherein each of the plurality of electrical connection test probes makes an electrical connection to a respective one of the plurality of electrical connection pads on the first face of the respective one of the plurality of integrated circuit devices under test and each of the thermally conductive test probes makes a thermal connection to the exposed die pad on the first face of the respective one of the plurality of integrated circuit devices under test; a test board assembly comprising a plurality of temperature measuring devices, each of the plurality of temperature measuring devices is thermally coupled to a respective one of the thermally conductive test probes for each of the integrated circuit devices under test; and a plurality of electrical connections, each of the plurality of electrical connections coupled to a respective one of the plurality of electrical connection test probes; the plurality of electrical connections provide electrical coupling to the plurality of electrical connection pads of the plurality of integrated circuit devices under test through the respective ones of the plurality of electrical connection test probes; and the plurality of temperature measuring devices measure temperatures of the respective ones of the plurality of integrated circuit devices under test through the exposed die pads on the first faces of the respective ones of the plurality of integrated circuit devices under test; wherein the temperature controlled heater block controls the temperatures of the plurality of integrated circuit devices under test and measured by the plurality of temperature measuring devices.

According to another specific example embodiment of this disclosure, an integrated circuit device strip tester that measures temperature of each device under test comprises: a temperature controlled heater block have a plurality of locations for placement thereon of a plurality of integrated circuit devices under test; each of the plurality of integrated circuit devices under test comprises a plurality of electrical connection pads on a first face of the integrated circuit device, an exposed die pad in thermal communications with a die of the integrated circuit device, and a second face of the integrated circuit device in thermal communications with the temperature controlled heater block; a contactor assembly having a plurality of electrical connection test probes and a temperature measuring test probe for each of the plurality of integrated circuit devices under test and arranged to come into contact therewith, wherein each of the plurality of electrical connection test probes makes an electrical connection to a respective one of the plurality of electrical connection pads on the first face of the respective one of the plurality of integrated circuit devices under test and each of the temperature measuring test probes makes a thermal connection to the exposed die pad on the first face of the respective one of the plurality of integrated circuit devices under test; a test board assembly comprising a plurality of electrical connections, each of the plurality of electrical connections coupled to a respective one of the plurality of electrical connection test probes; the plurality of electrical connections provide electrical coupling to the plurality of electrical connection pads of the plurality of integrated circuit devices under test through the respective ones of the plurality of electrical connection test probes; and the temperature measuring test probes measure temperatures of the respective ones of the plurality of integrated circuit devices under test through the exposed die pads on the first faces of the respective ones of the plurality of integrated circuit devices under test; wherein the temperature controlled heater block controls the temperatures of the plurality of integrated circuit devices under test and measured by the temperature measuring test probes.

BRIEF DESCRIPTION OF THE DRAWINGS

A more complete understanding of the present disclosure thereof may be acquired by referring to the following description taken in conjunction with the accompanying drawings wherein.

Figure 1:
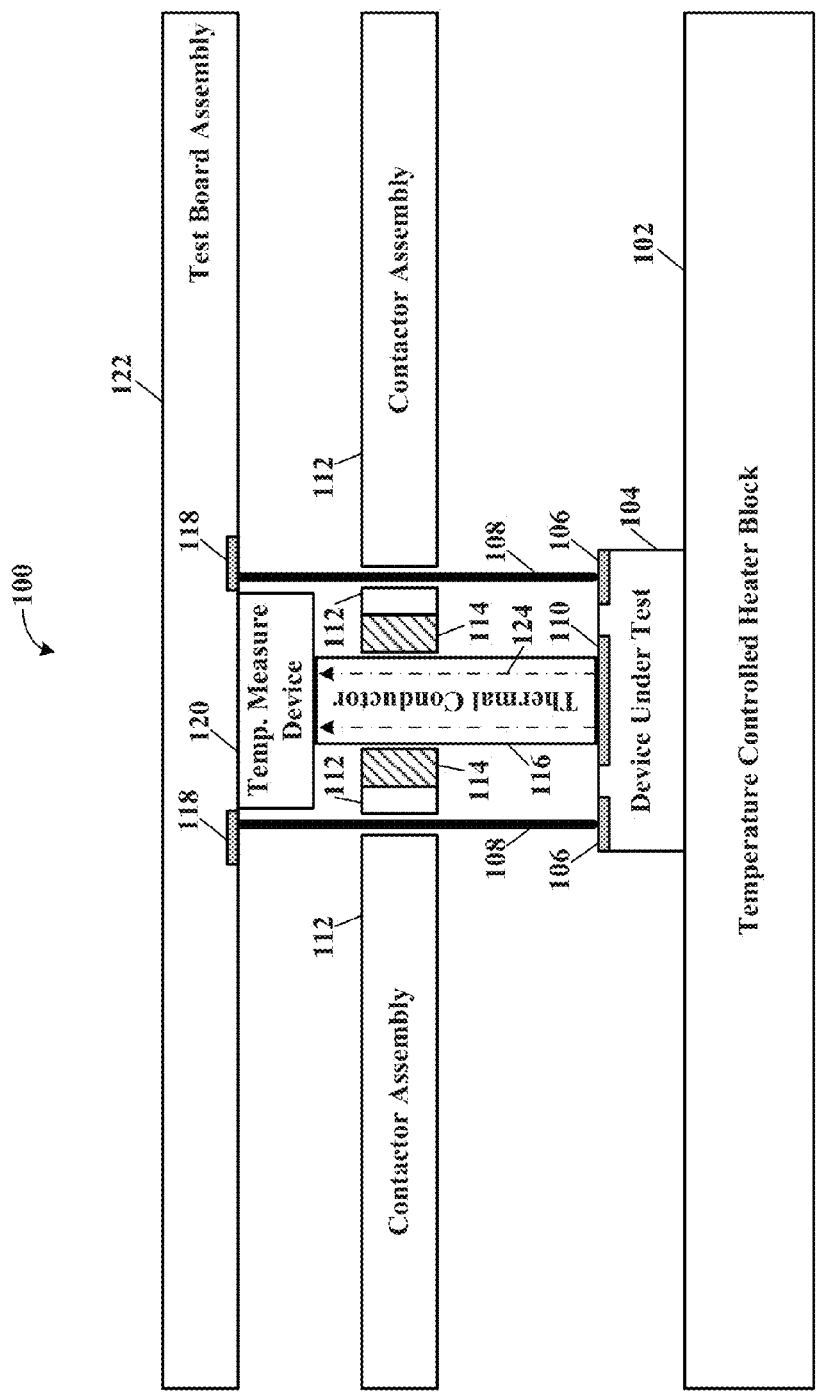
FIG. 1 illustrates a schematic elevational view of a strip tester for testing at least one integrated circuit device, according to a specific example embodiment of this disclosure.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims.

DETAILED DESCRIPTION

Referring now to the drawings, the details of example embodiments are schematically illustrated. Like elements in the drawings will be represented by like numbers, and similar elements will be represented by like numbers with a different lower case letter suffix.

Referring to FIG. 1, depicted is a schematic elevational view of a strip tester for testing at least one integrated circuit device, according to a specific example embodiment of this disclosure. An integrated circuit device strip tester, generally represented by the numeral 100, comprises a temperature controlled heater block 102, electrical connection test probes 108, a thermal test probe 116, a contactor assembly 112 having thermal insulating material 114 thereon, a temperature measuring device 120, and a test board assembly 122.

An integrated circuit device under test (DUT) 104 is shown mounted upside down with its top in thermal communications with the temperature controlled heater block 102, its electrical connection pads 106 in electrical communications with the electrical connection test probes 108, and its exposed die pad 110 in thermal communications with the thermal test probe 116. The electrical connection test probes 108 couple the electrical connection pads 106 to electrical connections 118 in the test board assembly 122 so that the DUT 104 can be electrically tested and/or calibrated (trimmed). The thermally conductive test probe 116 is also thermally coupled to a temperature measuring device 120 that may be attached to the test board assembly 122 as shown in FIG. 1, or a temperature measuring device 336 may be embedded in a thermal test probe as shown in FIG. 3(b). The contactor assembly 112 moves and then holds the electrical connection test probes 108 and the thermally conductive test probe 116 into contact with the DUT 104. Heat is conducted, represented by the arrows 124, from the exposed die pad 110, through the thermally conductive test probe 116, and then to the temperature measuring device 120. The DUT 104 may be encapsulated in, for example but is not limited to, the following integrated circuit packages: dual flat no-leads (DFN), thin dual flat no-leads (TDFN); 16-Lead Molded Leadless Package (MLP), JEDEC MO-220; Mini Small Outline Plastic Package (MSOP), and Small Outline Plastic Package (SOIC).

Figure 2:
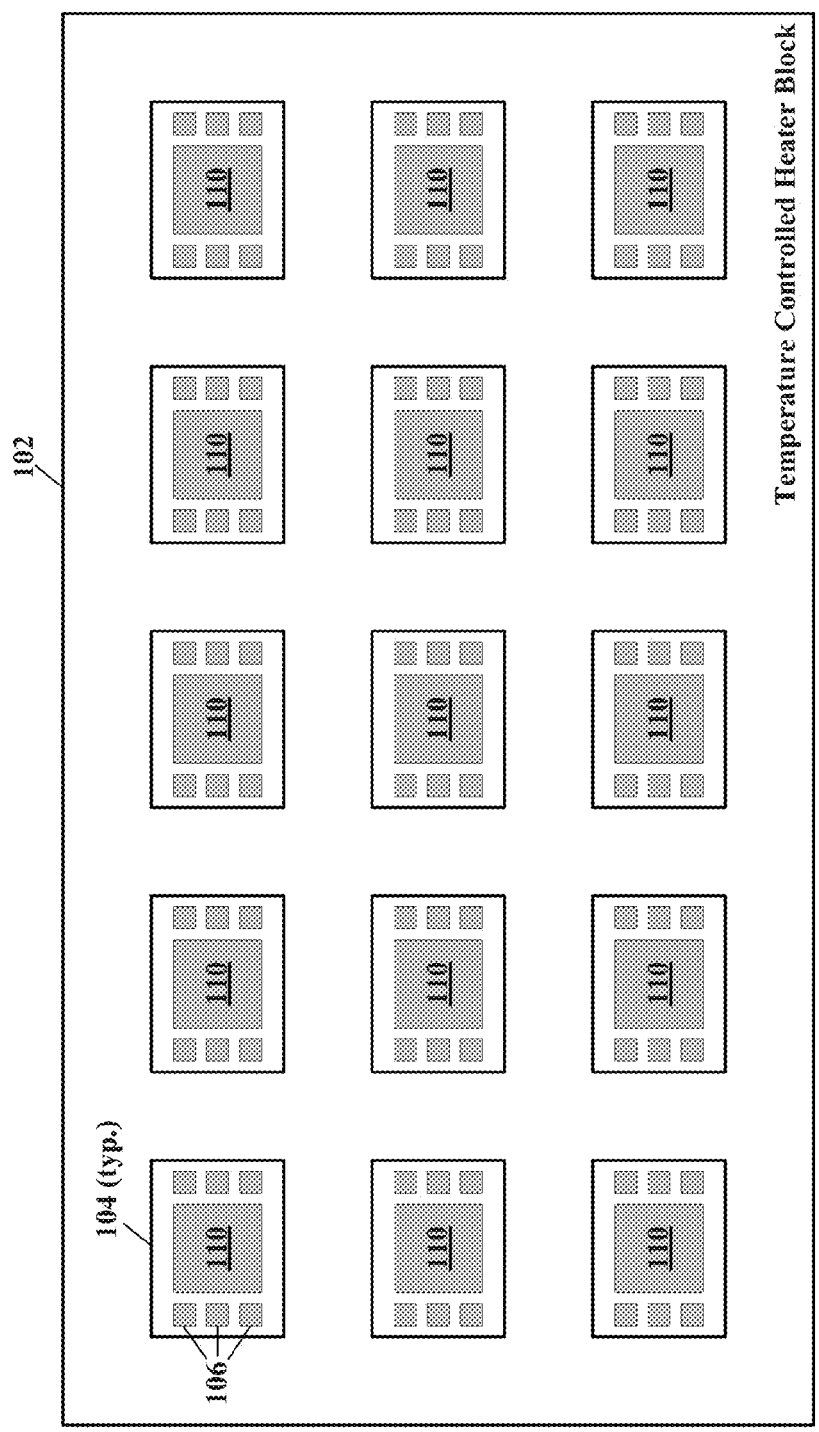
FIG. 2 illustrates a schematic plan view of a temperature controlled heater block of the strip tester shown in FIG. 1 and having a plurality of integrated circuit devices thereon.

Referring to FIG. 2, depicted is a schematic plan view of a temperature controlled heater block of the strip tester shown in FIG. 1 and having a plurality of integrated circuit devices thereon. A plurality of DUTs 104 may be placed on the temperature controlled heater block 102 as shown in FIG. 2. Each of the plurality of DUTs 104 have respective electrical connection test probes 108 and a thermal test probe 116 coupled thereto as shown in FIG. 1 for testing and/or calibrating (trimming) that DUT 104. It is contemplated and within the scope of this disclosure that each location of a respective one of the plurality of DUTs 104 may have independently controllable heating so that the temperatures for each of the plurality of DUTs 104 may be independently controlled based upon the measured temperatures through the respective thermal test probes 116.

Figure 3:
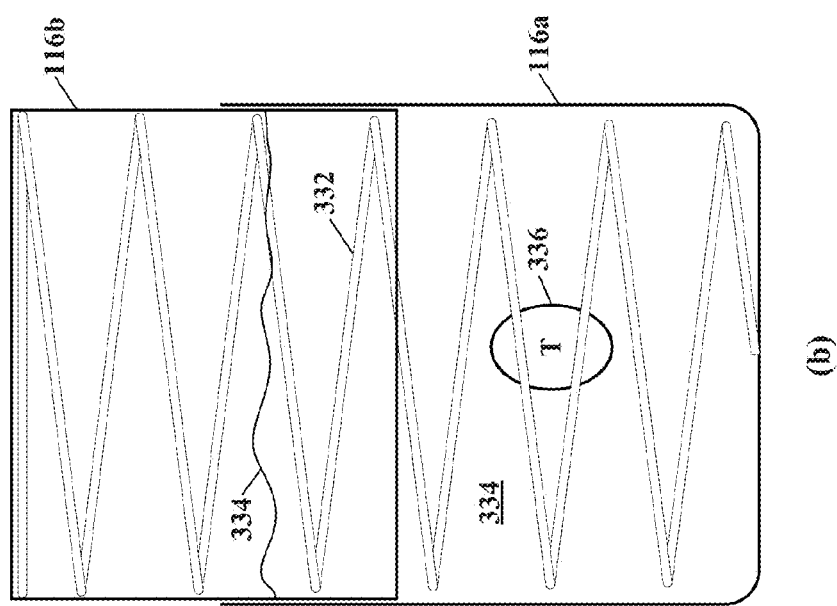
FIG. 3 illustrates schematic elevational views of a spring loaded pogo-pin style test probe and a mercury wetted test probe showing a temperature measuring device embedded therein, according to another specific example embodiment of this disclosure.
Figure 3:
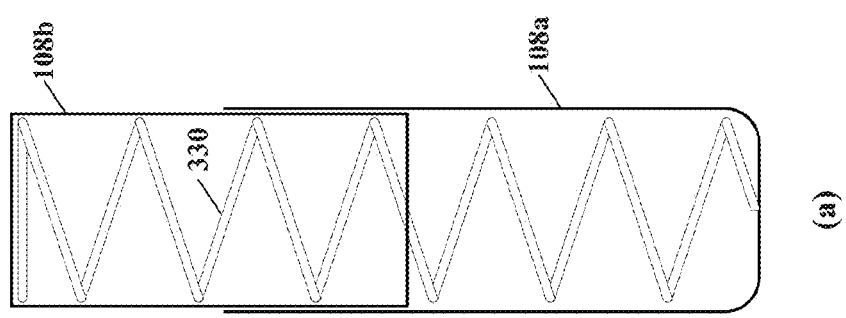

Referring to FIG. 3, depicted are schematic elevational views of a spring loaded pogo-pin style test probe and a mercury wetted test probe showing a temperature measuring device embedded therein, according to another specific example embodiment of this disclosure. A electrical connection test probe 108 shown in FIG. 1 is a compliant electrical interconnect that is a spring loaded device for performing positive electrical coupling to a respective electrical connection pad 106 of the DUT 104. The electrical connection test probe 108 may comprise a lower portion 108a and an upper portion 108b that are slidingly engaged with each other, and has a force spring 330 that provides contact pressure when the distal end of the lower portion 108a comes into contact with the electrical connection pad 106 of the DUT 104. A more detailed description of an electrical contact probe with compliant internal interconnect that may be used for the electrical connection test probes 108 is shown in U.S. Pat. No. 7,256,593, entitled "Electrical Contact Probe With Compliant Internal Interconnect," by Valts Treibergs, and is hereby incorporated by reference herein for all purposes. In addition, mercury may be used to "wet" the coterminous areas between the lower portion 108a and the upper portion 108b of the electrical connection test probes 108 for improved electrical conductivity therebetween.

The thermally conductive test probe 116 shown in FIG. 1 is a compliant interconnect that is a spring loaded device for performing positive thermal coupling to a respective exposed die pad 110 of the DUT 104. The thermally conductive test probe 116 may comprise a lower portion 116a and an upper portion 116b that are slidingly engaged with each other, and has a force spring 332 that provides contact pressure when the distal end of the lower portion 116a comes into contact with the exposed die pad 110 of the DUT 104. In addition, mercury may be used to "wet" the coterminous areas between the lower portion 116a and the upper portion 116b of the thermally conductive test probe 116 for improved thermal conductivity therebetween and response time for a change in temperature of the DUT 104.

Alternatively, a temperature sensor 336 may be located within the lower portion 116a and adapted to be in close thermal communications with the distal end of the lower portion 116a that is in thermal communications with the exposed die pad 110 of the DUT 104. By doing so, an increase in temperature measurement accuracy and a reduction in thermal response time may be achieved. By using a temperature sensor embedded in the lower portion 116a, the thermal test probe need not be thermally conductive its entire length. The temperature sensor 336 may be, for example but is not limited to, a resistance temperature detector (RTD), thermocouple, etc., having a similar thermal response time as the DUT 104.

While embodiments of this disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art and having the benefit of this disclosure. The depicted and described embodiments of this disclosure are examples only, and are not exhaustive of the scope of the disclosure.

What is claimed is:

1. An integrated circuit device strip tester that measures temperature of each device under test, comprising:
   a temperature controlled heater block have a plurality of locations for placement thereon of a plurality of integrated circuit devices under test;
   each of the plurality of integrated circuit devices under test comprises a plurality of electrical connection pads on a first face of the integrated circuit device, an exposed die pad in thermal communications with a die of the integrated circuit device, and a second face of the integrated circuit device in thermal communications with the temperature controlled heater block;
   a contactor assembly having a plurality of electrical connection test probes and a thermally conductive test probe for each of the plurality of integrated circuit devices under test and arranged to come into contact with a respective one of the plurality of integrated circuit devices under test, wherein each of the plurality of electrical connection test probes makes an electrical connection to a respective one of the plurality of electrical connection pads on the first face of the respective one of the plurality of integrated circuit devices under test and each of the thermally conductive test probes makes a thermal connection to the exposed die pad on the first face of the respective one of the plurality of integrated circuit devices under test;
   a test board assembly comprising
      a plurality of temperature measuring devices, each of the plurality of temperature measuring devices is thermally coupled to a respective one of the thermally conductive test probes for each of the integrated circuit devices under test; and
      a plurality of electrical connections, each of the plurality of electrical connections coupled to a respective one of the plurality of electrical connection test probes;
      the plurality of electrical connections provide electrical coupling to the plurality of electrical connection pads of the plurality of integrated circuit devices under test through the respective ones of the plurality of electrical connection test probes; and
      the plurality of temperature measuring devices measure temperatures of the respective ones of the plurality of integrated circuit devices under test through the exposed die pads on the first faces of the respective ones of the plurality of integrated circuit devices under test;
      wherein the temperature controlled heater block controls the temperatures of the plurality of integrated circuit devices under test and measured by the plurality of temperature measuring devices.

2. The integrated circuit device strip tester according to claim 1, wherein the temperature controlled heater block controls the temperatures of the plurality of integrated circuit devices under test based upon the temperatures measured by the respective ones of the plurality of temperature measuring devices.

3. The integrated circuit device strip tester according to claim 1, wherein the temperature controlled heater block comprises a plurality of integrated circuit heaters, each of the plurality of integrated circuit heaters are at the locations of the respective ones of the plurality of integrated circuit devices under test.

4. The integrated circuit device strip tester according to claim 3, further comprising the plurality of integrated circuit heaters control the temperatures of the respective ones of the plurality of integrated circuit devices under test based upon the temperatures measured by the respective ones of the plurality of temperature measuring devices.

5. The integrated circuit device strip tester according to claim 1, wherein the contactor assembly is thermally insulated from the thermally conductive test probes.

6. The integrated circuit device strip tester according to claim 1, wherein the plurality of electrical connection test probes and the thermally conductive test probes are compressible so as to dimensionally conform to the first faces of the plurality of integrated circuit devices.

7. The integrated circuit device strip tester according to claim 6, wherein each of the plurality of compressible electrical connection test probes and the compressible thermally conductive test probes are biased with a spring.

8. The integrated circuit device strip tester according to claim 1, further comprising using liquid mercury to increase electrical conductivity of the plurality of electrical connection test probes.

9. The integrated circuit device strip tester according to claim 1, further comprising using liquid mercury to increase thermal conductivity of the thermally conductive test probes.

10. The integrated circuit device strip tester according to claim 1, wherein the plurality of temperature measuring devices comprise a plurality of temperature measuring RTDs.

11. The integrated circuit device strip tester according to claim 1, wherein the plurality of temperature measuring devices comprise a plurality of thermocouples.

12. The integrated circuit device strip tester according to claim 1, wherein the plurality of temperature measuring devices comprise a plurality of thermistors.

13. The integrated circuit device strip tester according to claim 1, wherein the device under test is an integrated circuit in a package.

14. The integrated circuit device strip tester according to claim 13, wherein the integrated circuit package is selected from the group consisting of dual flat no-leads (DFN), thin dual flat no-leads (TDFN); 16-Lead Molded Leadless Package (MLP), JEDEC MO-220; Mini Small Outline Plastic Package (MSOP), and Small Outline Plastic Package (SOIC).

15. An integrated circuit device strip tester that measures temperature of each device under test, comprising:
   a temperature controlled heater block have a plurality of locations for placement thereon of a plurality of integrated circuit devices under test;
   each of the plurality of integrated circuit devices under test comprises a plurality of electrical connection pads on a first face of the integrated circuit device, an exposed die pad in thermal communications with a die of the integrated circuit device, and a second face of the integrated circuit device in thermal communications with the temperature controlled heater block;
   a contactor assembly having a plurality of electrical connection test probes and a temperature measuring test probe for each of the plurality of integrated circuit devices under test and arranged to come into contact therewith, wherein each of the plurality of electrical connection test probes makes an electrical connection to a respective one of the plurality of electrical connection pads on the first face of the respective one of the plurality of integrated circuit devices under test and each of the temperature measuring test probes makes a thermal connection to the exposed die pad on the first face of the respective one of the plurality of integrated circuit devices under test;
   a test board assembly comprising
      a plurality of electrical connections, each of the plurality of electrical connections coupled to a respective one of the plurality of electrical connection test probes;
      the plurality of electrical connections provide electrical coupling to the plurality of electrical connection pads of the plurality of integrated circuit devices under test through the respective ones of the plurality of electrical connection test probes; and
      the temperature measuring test probes measure temperatures of the respective ones of the plurality of integrated circuit devices under test through the exposed die pads on the first faces of the respective ones of the plurality of integrated circuit devices under test;
      wherein the temperature controlled heater block controls the temperatures of the plurality of integrated circuit devices under test and measured by the temperature measuring test probes.

16. The integrated circuit device strip tester according to claim 15, wherein the temperature controlled heater block controls the temperatures of the plurality of integrated circuit devices under test based upon the temperatures measured by the respective temperature measuring test probes.

17. The integrated circuit device strip tester according to claim 15, wherein the temperature controlled heater block comprises a plurality of integrated circuit heaters, each of the plurality of integrated circuit heaters are at the locations of the respective ones of the plurality of integrated circuit devices under test.

18. The integrated circuit device strip tester according to claim 17, further comprising the plurality of integrated circuit heaters control the temperatures of the respective ones of the plurality of integrated circuit devices under test based upon the temperatures measured by the respective temperature measuring test probes.

19. The integrated circuit device strip tester according to claim 15, wherein the contactor assembly is thermally insulated from the temperature measuring test probes.

20. The integrated circuit device strip tester according to claim 15, wherein the plurality of electrical connection test probes and the temperature measuring test probes are compressible so as to dimensionally conform to the first faces of the plurality of integrated circuit devices.

21. The integrated circuit device strip tester according to claim 20, wherein each of the plurality of compressible electrical connection test probes and the compressible temperature measuring test probes are biased with a spring.

22. The integrated circuit device strip tester according to claim 15, further comprising using liquid mercury to increase electrical conductivity of the plurality of electrical connection test probes.

23. The integrated circuit device strip tester according to claim 15, further comprising using liquid mercury to increase thermal conductivity of the temperature measuring test probes.

24. The integrated circuit device strip tester according to claim 15, wherein each of the temperature measuring test probes includes a temperature measuring resistance temperature detector (RTD).

25. The integrated circuit device strip tester according to claim 15, wherein each of the temperature measuring test probes includes a thermocouple.

26. The integrated circuit device strip tester according to claim 15, wherein each of the temperature measuring test probes includes a thermistor.

27. The integrated circuit device strip tester according to claim 15, wherein the device under test is an integrated circuit in a package.

28. The integrated circuit device strip tester according to claim 27, wherein the integrated circuit package is selected from the group consisting of dual flat no-leads (DFN), thin dual flat no-leads (TDFN); 16-Lead Molded Leadless Package (MLP), JEDEC MO-220; Mini Small Outline Plastic Package (MSOP), and Small Outline Plastic Package (SOIC).

* * * * *